(12) United States Patent
Kuriyama et al.

(10) Patent No.: US 10,164,180 B2
(45) Date of Patent: Dec. 25, 2018

(54) VARIABLE RESISTANCE ELEMENT AND MEMORY DEVICE

(71) Applicant: Toshiba Memory Corporation, Minato-ku (JP)

(72) Inventors: Hiromichi Kuriyama, Kuwana (JP); Yuya Matsubara, Yokkaichi (JP); Kazunori Harada, Kawasaki (JP); Takuya Hirohashi, Ebina (JP); Harumi Seki, Kawasaki (JP); Masumi Saitoh, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/704,802

(22) Filed: Sep. 14, 2017

(65) Prior Publication Data

US 2018/0145251 A1   May 24, 2018

(30) Foreign Application Priority Data

Nov. 21, 2016   (JP) .................................. 2016-225811

(51) Int. Cl.
*G11C 11/00* (2006.01)
*H01L 45/00* (2006.01)
*G11C 13/00* (2006.01)

(52) U.S. Cl.
CPC ............ *H01L 45/10* (2013.01); *G11C 13/004* (2013.01); *G11C 13/0011* (2013.01);
(Continued)

(58) Field of Classification Search
CPC ............ G11C 13/0002; G11C 13/0038; G11C 13/0061; G11C 11/161; G11C 11/1673;
(Continued)

(56) References Cited

U.S. PATENT DOCUMENTS 8,334,525 B2 * 12/2012 Nakai .................. H01L 45/126
365/163
8,723,152 B2    5/2014 Nishi et al.
(Continued)

FOREIGN PATENT DOCUMENTS

JP   4868518   2/2012
JP   5543819   7/2014
(Continued)

OTHER PUBLICATIONS

Huolin L. Xin, et al. "Three-dimensional imaging of pore structures inside low-$_K$ dielectrics", Applied Physics Letters 96, 223108, 2010, 4 pages.

*Primary Examiner* — Thong Q Le
(74) *Attorney, Agent, or Firm* — Oblon, McClelland, Maier & Neustadt, L.L.P.

(57) ABSTRACT

According to one embodiment, a variable resistance element includes first and second conductive layers and a first layer. The first conductive layer includes at least one of silver, copper, zinc, titanium, vanadium, chrome, manganese, iron, cobalt, nickel, tellurium, or bismuth. The second conductive layer includes at least one of platinum, gold, iridium, tungsten, palladium, rhodium, titanium nitride, or silicon. The first layer includes oxygen and silicon and is provided between the first conductive layer and the second conductive layer. The first layer includes a plurality of holes. The holes are smaller than a thickness of the first layer along a first direction. The first direction is from the second conductive layer toward the first conductive layer. The first layer does not include carbon, or a composition ratio of carbon included in the first layer to silicon included in the first layer is less than 0.1.

11 Claims, 3 Drawing Sheets

(52) U.S. Cl.
CPC ...... *G11C 13/0069* (2013.01); *G11C 13/0097* (2013.01); *H01L 45/1233* (2013.01); *H01L 45/1253* (2013.01); *H01L 45/146* (2013.01); *G11C 2013/0045* (2013.01); *G11C 2013/0078* (2013.01); *G11C 2213/33* (2013.01); *G11C 2213/34* (2013.01); *G11C 2213/52* (2013.01); *G11C 2213/56* (2013.01)

(58) Field of Classification Search
CPC . G11C 11/5685; G11C 13/0007; G11C 14/00; G11C 2213/15; G11C 2213/32; G11C 2213/34
USPC ..... 365/148, 163, 158, 189.011, 230.03, 63; 57/2; 257/4, E45.002, E21.004, E21.645, 257/42, E21.09, E27.004, E31.029, 257/E45.001
See application file for complete search history.

(56) References Cited

U.S. PATENT DOCUMENTS

| | | |
|---|---|---|
| 8,916,848 B2 | 12/2014 | Fujii et al. |
| 8,946,672 B2 | 2/2015 | Tada et al. |
| 2016/0276410 A1 | 9/2016 | Seki et al. |

FOREIGN PATENT DOCUMENTS

| | | |
|---|---|---|
| JP | 5611903 | 10/2014 |
| JP | 5692085 | 4/2015 |
| JP | 5975121 | 8/2016 |
| JP | 2016-178155 | 10/2016 |

\* cited by examiner

VARIABLE RESISTANCE ELEMENT AND MEMORY DEVICE

CROSS-REFERENCE TO RELATED APPLICATIONS

This application is based upon and claims the benefit of priority from Japanese Patent Application No.2016-225811, filed on Nov. 21, 2016; the entire contents of which are incorporated herein by reference.

FIELD

Embodiments described herein relate generally to a variable resistance element and a memory device.

BACKGROUND

A memory device that uses a variable resistance element has been proposed. Stable operations of the variable resistance element are desirable.

DETAILED DESCRIPTION

Figure 1:
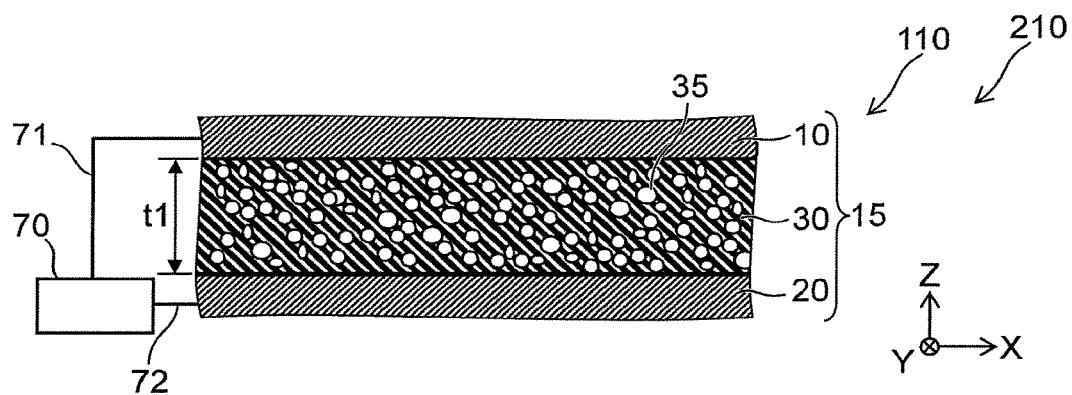
FIG. 1 is a schematic cross-sectional view illustrating a variable resistance element according to a first embodiment.

According to one embodiment, a variable resistance element includes a first conductive layer, a second conductive layer, and a first layer. The first conductive layer includes at least one selected from the group consisting of silver, copper, zinc, titanium, vanadium, chrome, manganese, iron, cobalt, nickel, tellurium, and bismuth. The second conductive layer includes at least one selected from the group consisting of platinum, gold, iridium, tungsten, palladium, rhodium, titanium nitride, and silicon. The first layer includes oxygen and silicon and is provided between the first conductive layer and the second conductive layer. The first layer includes a plurality of holes. The holes are smaller than a thickness of the first layer along a first direction. The first direction is from the second conductive layer toward the first conductive layer. The first layer does not include carbon, or a composition ratio of carbon included in the first layer to silicon included in the first layer is less than 0.1.

According to one embodiment, a memory device includes the variable resistance element recited above and a controller. The controller is electrically connected to the first conductive layer and the second conductive layer. The controller is configured to implement a first operation of setting a first potential of the first conductive layer to be higher than a second potential of the second conductive layer, and a second operation of setting the first potential to be lower than the second potential. A first electrical resistance between the first conductive layer and the second conductive layer after the first operation is lower than a second electrical resistance between the first conductive layer and the second conductive layer after the second operation.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a variable resistance element according to a first embodiment.

As shown in FIG. 1, the variable resistance element 110 according to the first embodiment includes a first conductive layer 10, a second conductive layer 20, and a first layer 30.

A first direction from the second conductive layer 20 toward the first conductive layer 10 is taken as a Z-axis direction. One direction perpendicular to the Z-axis direction is taken as an X-axis direction. A direction perpendicular to the Z-axis direction and the X-axis direction is taken as a Y-axis direction. The Z-axis direction is the stacking direction of a stacked body 15 including the first conductive layer 10, the second conductive layer 20, and the first layer 30.

The first conductive layer 10 includes, for example, at least one selected from the group consisting of silver, copper, zinc, titanium, vanadium, chrome, manganese, iron, cobalt, nickel, tellurium, and bismuth. The first conductive layer 10 includes, for example, at least one selected from the group consisting of silver and copper.

The second conductive layer 20 includes, for example, at least one selected from the group consisting of platinum, gold, iridium, tungsten, palladium, rhodium, titanium nitride, and silicon.

For example, the first conductive layer 10 is ionized more easily than the second conductive layer 20. The first conductive layer 10 functions as, for example, an ion source.

The first layer 30 is provided between the first conductive layer 10 and the second conductive layer 20. The first layer 30 includes oxygen and silicon. In the example, for example, the first layer 30 physically contacts the first conductive layer 10 and the second conductive layer 20.

The first layer 30 includes multiple holes 35. The first layer 30 is porous. The multiple holes 35 are smaller than a thickness t1 of the first layer 30. The thickness t1 is the length of the first layer 30 along the first direction (the Z-axis direction). For example, the average of the sizes of the multiple holes 35 is smaller than the thickness t1.

For example, the first layer 30 substantially does not include carbon. Or, in the case where the first layer 30 includes carbon, the composition ratio of carbon to silicon in the first layer 30 is less than 0.1. For example, the composition ratio of the carbon included in the first layer 30 to the silicon included in the first layer 30 is less than 0.1.

For example, it was found that good retention characteristics are obtained as described below by using such a first layer 30.

For example, the variable resistance element 110 can be used as a memory cell of a memory device.

As shown in FIG. 1, the memory device 210 includes a controller 70 and the variable resistance element 110 recited above. The controller 70 is electrically connected to the first conductive layer 10 and the second conductive layer 20. In the example, the first conductive layer 10 and the controller 70 are electrically connected by a first interconnect 71. The second conductive layer 20 and the controller 70 are electrically connected by a second interconnect 72. A switching element such as a transistor or the like, etc., may be provided in at least one of these interconnects.

The controller 70 can implement a first operation and a second operation. In the first operation, the controller 70 sets a first potential of the first conductive layer 10 to be higher than a second potential of the second conductive layer 20. In the second operation, the controller 70 sets the first potential of the first conductive layer 10 to be lower than the second potential of the second conductive layer 20. When the potential of the first conductor is higher than the potential of the second conductor, a current flows from the first conductor toward the second conductor.

For example, in the memory device 210, a first electrical resistance between the first conductive layer 10 and the second conductive layer 20 after the first operation is lower than a second electrical resistance between the first conductive layer 10 and the second conductive layer 20 after the second operation.

For example, by the first operation, the ions of a metallic element (e.g., silver ions) included in the first conductive layer 10 are moved toward the second conductive layer 20. It is considered that a current path (e.g., a filament) is formed of the ions between the first conductive layer 10 and the second conductive layer 20. Thereby, after the first operation, the electrical resistance between the first conductive layer 10 and the second conductive layer 20 is low. The current path that is formed is maintained for some amount of time even after the difference of the potentials is removed. The first operation corresponds to, for example, a set operation. The voltage for forming the low resistance state is, for example, a set voltage.

On the other hand, for example, by the second operation, the current path that is formed becomes ions (e.g., silver ions) and moves toward the first conductive layer 10. For example, the current path disappears. Thereby, after the second operation, the electrical resistance between the first conductive layer 10 and the second conductive layer 20 becomes high. The second electrical resistance after the second operation is higher than the first electrical resistance after the first operation. Thus, a change of the resistance occurs in the variable resistance element 110. The second operation corresponds to, for example, a reset operation. The voltage for forming the high resistance state corresponds to, for example, a reset voltage.

It is desirable for the change of the resistance such as that recited above to be stable even after the potential difference is removed. In other words, good retention characteristics of the variable resistance element are desirable.

In the memory device 210 and the variable resistance element 110 according to the embodiment, it was found that good retention characteristics are obtained by using the first layer 30 such as that recited above.

Experimental results that relate to the retention characteristics will now be described.

In a first experiment, a titanium nitride film is provided as the second conductive layer 20 on a substrate. Multiple types of silicon oxide films are formed by plasma CVD (plasma-enhanced chemical vapor deposition (PE-CVD)) as the first layer 30 on the titanium nitride film. In the experiment, two different types of gases are used as the source gas. The first source gas is TEOS (tetraethyl orthosilicate). In the film formation using the first source gas, conditions (the gas flow rate ratio, the film formation temperature, etc.) are employed so that a porous film is formed. The oxidizing gas that is used in the film formation is $O_2$ gas. The second source gas is different from TEOS. It is known that a dense film is formed when using the second source gas. These silicon oxide films that are formed are amorphous. A silver film is formed by sputtering as the first conductive layer 10 on the silicon oxide film.

The density of the silicon oxide film for these samples is evaluated by an X-ray reflectivity measurement (XRR (X-Ray Reflectivity)). The formation state of the multiple holes 35 is evaluated using a scanning transmission electron microscope.

The retention characteristics of these samples are further evaluated. To evaluate the retention characteristics, a voltage (the set voltage) that corresponds to the first operation is applied to each of these samples; and the stacked body 15 is set to the low resistance state. The electrical resistance directly after these samples are made is taken as the initial resistance. These samples are held at various "holding temperatures." After being held at the "holding temperature," the electrical resistance of the stacked body 15 is measured. The elapsed time for the difference between the electrical resistance and the initial resistance to become 0.2 times the initial resistance is taken as the "holding time."

Figure 2:
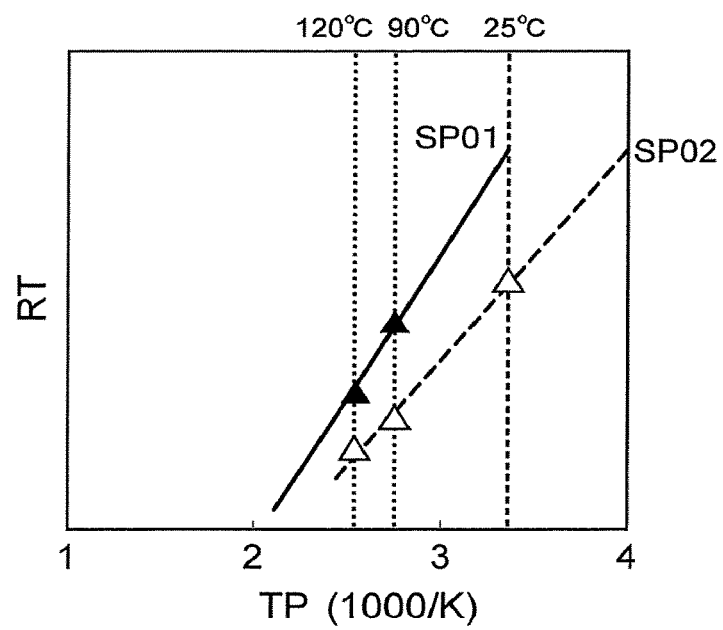
FIG. 2 is a graph illustrating a characteristic of the variable resistance element.

FIG. 2 is a graph illustrating a characteristic of the variable resistance element.

FIG. 2 illustrates the evaluation results of the "holding time." The horizontal axis of FIG. 2 is a holding temperature parameter TP. The holding temperature parameter TP is 1000 times the reciprocal of the holding temperature (Kelvin). The holding temperature increases as the holding temperature parameter TP decreases. The vertical axis of FIG. 2 is a holding time RT. The holding time RT is a logarithmic display and is normalized. The characteristic of a first sample SP01 in which the first source gas is used and the characteristic of a second sample SP02 in which the second source gas is used are shown in FIG. 2.

It can be seen from FIG. 2 that the holding time RT of the first sample SP01 is longer than the holding time RT of the second sample SP02. For the same holding temperature, the holding time RT of the first sample SP01 is not less than 10 times the holding time RT of the second sample SP02.

On the other hand, the multiple holes 35 are observed in the first sample SP01. The density of the first sample SP01 is 2.0 $g/cm^3$. 1 $g/cm^3$ is 1000 $kg/m^3$.

On the other hand, the multiple holes 35 are not formed in the second sample SP02; and the second sample SP02 is a dense film. The density of the second sample SP02 is 2.2 $g/cm^3$. The high density matches the multiple holes 35 not being formed.

Thus, it was found that good retention characteristics are obtained by providing the multiple holes 35 in the first layer 30.

For example, in the first operation, the current path is formed of silver ions; and the low resistance state is formed. For example, it is considered that the current path is formed to link the multiple holes 35 inside the silicon oxide film. Subsequently, when left idle, the silver of the current path tries to diffuse into the periphery. At this time, it is considered that the silver collects easily inside the holes 35 if the multiple holes 35 are formed in the silicon oxide film. It is estimated that this may cause the holding time RT to lengthen in the case where the multiple holes 35 are formed. On the other hand, in the case where the holes 35 are not formed, it is considered that the current path that is formed disappears easily because the diffusion of the silver is not suppressed.

The carbon that is included in the first sample SP01 and the second sample SP02 recited above is low. In these samples, the composition ratio C/Si (the composition ratio of carbon to silicon) is 0.01 or less. The composition ratio C/Si is obtained by electron energy loss spectrometry.

In the embodiment as described above, for example, the first layer 30 substantially does not include carbon. Or, the composition ratio of carbon to silicon in the first layer 30 is less than 0.1. Because the carbon that is included in the first layer 30 is low, for example, high stability of the first layer 30 is obtained.

For example, in the case where carbon is included in the first layer 30, the characteristics of the first layer 30 change easily due to chemical changes (e.g., oxidization of the carbon, etc.). For example, the chemical changes are accelerated when the first operation and the second operations are performed repeatedly in the variable resistance element 110. For example, there are cases where heat treatment or the like is performed after the formation of the first layer 30 to reduce the resistance of the interconnects, etc. The chemical changes of the first layer 30 are accelerated by such heat treatment. In the case where carbon is included in the first layer 30, the characteristics may degrade due to such heat treatment.

In the embodiment, the first layer 30 substantially does not include carbon, or the carbon content is low. Thereby, for example, the chemical changes are suppressed; and stable characteristics are obtained.

Thus, thermal stability is provided by using the first layer 30 that has a low carbon content and includes the fine multiple holes 35. Good retention characteristics are obtained. According to the embodiment, a variable resistance element and a memory device can be provided in which stable operations are possible.

In the embodiment, for example, the multiple holes 35 are smaller than the thickness t1 of the first layer 30. For example, the holes 35 do not pierce through the first layer 30. For example, if the sizes of the holes become excessively large, the holes pierce through the first layer 30. In such a case, for example, the material that is included in the first conductive layer 10 or the material that is included in the second conductive layer 20 is easily filled into the holes. Leaks or shorts occur easily.

In the embodiment, the multiple holes 35 are sufficiently smaller than the thickness t1 of the first layer 30. Thereby, the leaks or shorts can be suppressed.

Further, in the embodiment, the operating voltage can be reduced as described below.

In a second experiment, the first source gas is used; and the film formation conditions (the gas flow rate ratio, the film formation temperature, etc.) are modified. Thereby, various silicon oxide films are formed. Otherwise, the samples are made using conditions that are similar to those of the first experiment. The density of the silicon oxide film is measured for these samples. On the other hand, the operating voltage (the set voltage) is measured for these samples.

Figure 3:
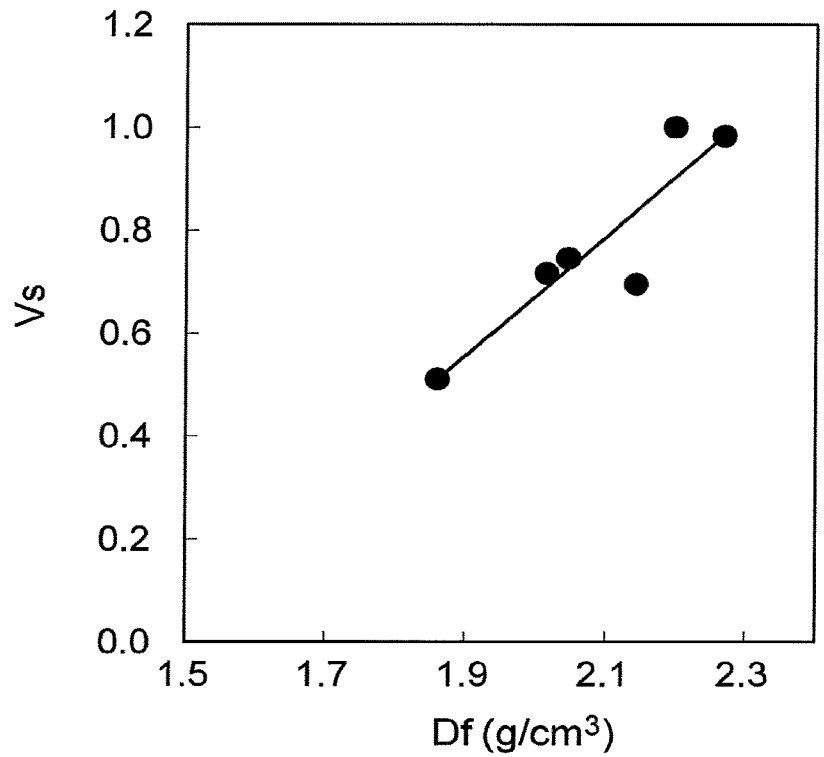
FIG. 3 is a graph illustrating a characteristic of the variable resistance element.

FIG. 3 is a graph illustrating a characteristic of the variable resistance element.

The horizontal axis of FIG. 3 is a density Df ($g/cm^3$). The vertical axis is an operating voltage Vs (the set voltage). The operating voltage is displayed as being normalized.

As shown in FIG. 3, a density of 1.85 $g/cm^3$ to 2.13 $g/cm^3$ is obtained by using the first source gas and by modifying the film formation conditions. The difference of the densities corresponds to the formation states of the multiple holes 35.

As shown in FIG. 3, the operating voltage Vs is low when the density Df is small.

For example, the sizes of the multiple holes 35 increase as the density Df decreases. Or, the density of the multiple holes 35 inside the silicon oxide film increases as the density Df decreases. It is considered that the current path is formed of the silver more easily as the size or the density of the holes 35 increases. It is estimated that this is caused by the operating voltage Vs decreasing as the density Df decreases.

A third experiment will now be described in which the relationship between the operating voltage and the concentration of carbon inside the silicon oxide film is verified.

In the third experiment, the first source gas is used; and the film formation conditions (the gas flow rate ratio, the film formation temperature, etc.) are modified. The oxidizing gas that is used in the film formation is $O_2$ gas or $N_2O$ gas. Generally, in the case where the $N_2O$ gas is used, carbon that originates in organic substances inside the first source gas (TEOS) remains easily inside the film. Various silicon oxide films are formed using such conditions. Otherwise, the samples are made using conditions that are similar to those of the first experiment. The operating voltage (the set voltage) and the amount (the density) of carbon inside the silicon oxide film are measured for these samples.

Figure 4:
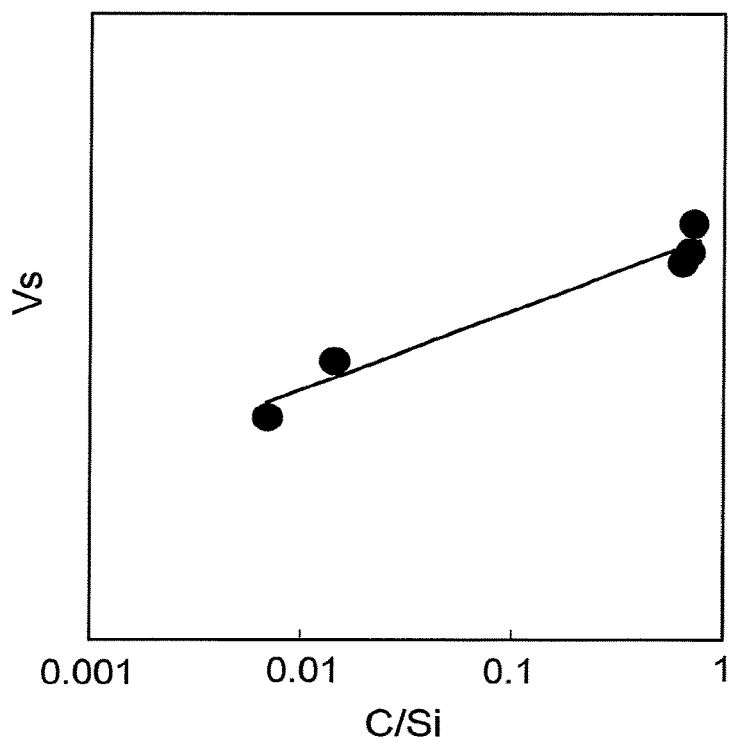
FIG. 4 is a graph illustrating a characteristic of the variable resistance element.

FIG. 4 is a graph illustrating a characteristic of the variable resistance element.

The horizontal axis of FIG. 4 is the composition ratio C/Si (the composition ratio of carbon to silicon). The vertical axis is the operating voltage Vs. The operating voltage is displayed as being normalized.

In FIG. 4, the samples that have the high composition ratio C/Si correspond to the case where the oxidizing gas is the $N_2O$ gas. The samples that have the low composition ratio C/Si correspond to the case where the oxidizing gas is the $O_2$ gas. As shown in FIG. 4, the operating voltage Vs decreases as the composition ratio C/Si decreases.

It is considered that, for example, the multiple holes 35 are filled more easily with carbon as the composition ratio C/Si increases. Therefore, it is considered that it is difficult to form the current path. It is considered that when the composition ratio C/Si is low, the current path is formed easily, and as a result, the operating voltage Vs decreases.

In the embodiment, the composition ratio C/Si is, for example, 0.05 or less. The composition ratio C/Si may be, for example, 0.02 or less. The composition ratio C/Si may be, for example, 0.015 or less.

The composition ratios of oxygen and silicon inside the silicon oxide film will now be described.

Figure 5:
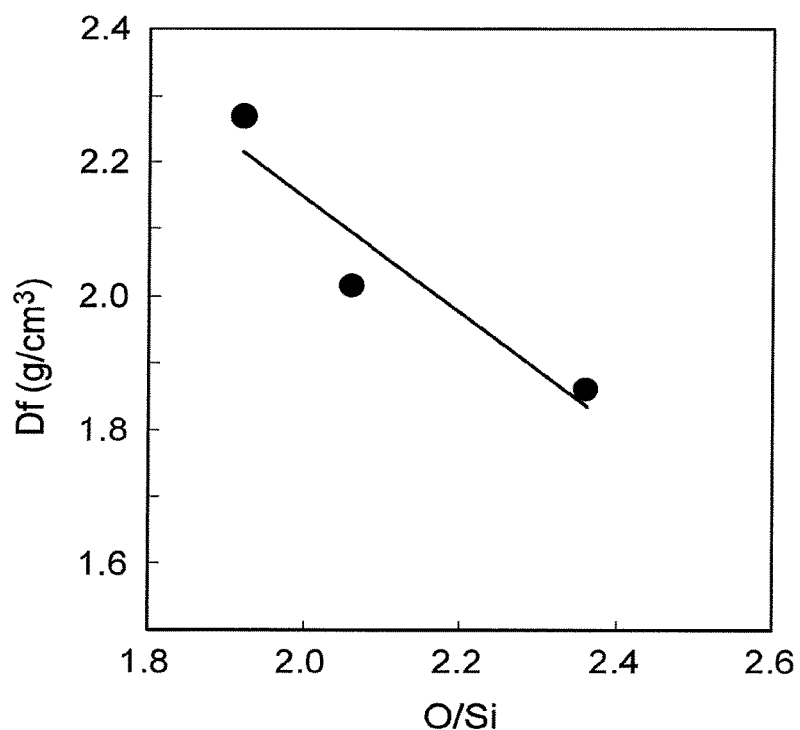
FIG. 5 is a graph illustrating a characteristic of the variable resistance element.

FIG. 5 is a graph illustrating a characteristic of the variable resistance element.

FIG. 5 shows the relationship between the density Df and the composition ratio "O/Si" (the composition ratio of oxygen to silicon) inside the silicon oxide film for a portion of the samples of the third experiment recited above. The horizontal axis of FIG. 5 is the composition ratio O/Si (the composition ratio of oxygen to silicon). The vertical axis is the density Df of the silicon oxide film.

As shown in FIG. 5, the density Df increases as the composition ratio O/Si decreases. The multiple holes 35 substantially are not formed when the density Df is 2.2 g/cm³ or more. The multiple holes 35 are formed when the density Df is less than 2.2 g/cm³. For example, the multiple holes 35 are formed stably when the composition ratio O/Si exceeds 2.0. In the embodiment, the composition ratio O/Si (the composition ratio of the oxygen included in the first layer 30 to the silicon included in the first layer 30) is greater than 2.2. In the embodiment, the composition ratio O/Si is, for example, 2.4 or less. In the embodiment as shown in FIG. 5, the composition ratio O/Si may be, for example, greater than 2.05 and not more than 2.4. The multiple holes 35 are obtained stably.

In the embodiment, the density of the first layer 30 is, for example, not less than 1.5 g/cm³ but less than 2.2 g/cm³. The density of the first layer 30 is, for example, not less than 1.85 g/cm³ but less than 2.2 g/cm³. The density of the first layer 30 is, for example, not less than 1.85 g/cm³ and not more than 2.0 g/cm³.

In the embodiment, the average size of the multiple holes 35 (the average length of the multiple holes 35 along the first direction (the Z-axis direction)) is not more than 0.5 times the first layer 30 thickness t1 (referring to FIG. 1). Because the average size of the multiple holes 35 is not more than 0.5 times, the multiple holes 35 that become continuous in the Z-axis direction can be substantially suppressed inside the first layer 30. Thereby, the shorts or leaks can be suppressed. In the embodiment, the sizes of the multiple holes 35 may be 0.2 times the thickness t1 or less. The shorts or leaks can be suppressed more stably.

In the embodiment, for example, the average length of the multiple holes 35 along the first direction is not less than 0.6 nm and not more than 1.5 nm. On the other hand, the thickness t1 of the first layer 30 is, for example, not less than 2 nanometers and not more than 10 nanometers.

As described above, the second conductive layer 20 includes, for example, at least one selected from the group consisting of platinum, gold, iridium, tungsten, palladium, rhodium, titanium nitride, and silicon. The silicon includes, for example, an impurity. For example, the second conductive layer 20 includes at least one of polycrystalline silicon including at least one element selected from the group consisting of boron, arsenic, and phosphorus, or amorphous silicon including the element recited above. For example, the resistivity of the second conductive layer 20 is, for example, 0.005 Ωcm or less.

Second Embodiment

Figure 6:
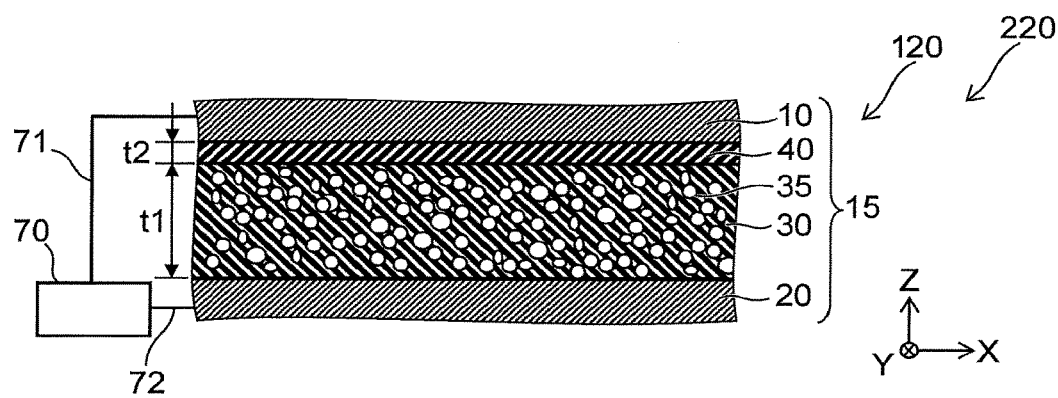
FIG. 6 is a schematic cross-sectional view illustrating a variable resistance element according to a second embodiment.

FIG. 6 is a schematic cross-sectional view illustrating a variable resistance element according to a second embodiment.

As shown in FIG. 6, the memory device 220 and the variable resistance element 120 according to the second embodiment include a second layer 40 in addition to the first conductive layer 10, the second conductive layer 20, and the first layer 30. The first conductive layer 10, the second conductive layer 20, and the first layer 30 are similar to those of the variable resistance element 110 or the memory device 210. The second layer 40 will now be described.

The second layer 40 is provided between the first conductive layer 10 and the first layer 30. The relative dielectric constant of the second layer 40 is higher than the relative dielectric constant of the first layer 30.

The second layer 40 includes, for example, an oxide including at least one selected from the group consisting of aluminum, hafnium, titanium, tantalum, and zirconium, or an oxynitride including at least one selected from the group consisting of aluminum, hafnium, titanium, tantalum, zirconium, and silicon.

For example, the leakage current can be suppressed by providing the second layer 40. The first layer 30 has the multiple holes 35 as recited above. Therefore, for example, when the first conductive layer 10 is formed on the first layer 30 in the case where the second layer 40 is not provided, the first layer 30 may be damaged. In such a case, the leakage current occurs easily. For example, the leakage current can be suppressed by providing the second layer 40 between the first layer 30 and the first conductive layer 10. For example, stable switching operations are obtained. For example, good retention characteristics are obtained.

By setting the relative dielectric constant of the second layer 40 to be higher than the relative dielectric constant of the first layer 30, for example, the operating voltage increase due to the insertion of the second layer 40 can be suppressed more than in the case where the relative dielectric constant is low.

A thickness t2 of the second layer 40 (the length of the second layer 40 along the first direction) is, for example, not less than 0.2 nanometers and not more than 2 nanometers. By setting the thickness t2 of the second layer 40 to be 0.2 nm or more, for example, the penetration of the metal atoms in the formation of the first conductive layer 10 can be suppressed effectively. Thereby, the leakage current can be suppressed effectively. By setting the thickness t2 of the second layer 40 to be 2 nm or less, for example, the effect on the movement of the metal ions can be suppressed. For example, a low operating voltage can be maintained.

In the embodiment, the second layer 40 may be formed by, for example, atomic layer deposition (ALD). For example, the second layer 40 is formed on the first layer 30. The first conductive layer 10 is formed on the second layer 40.

In the first and second embodiments recited above, the second conductive layer 20 may be formed by, for example, sputtering or vapor deposition. The first layer 30 may be formed by, for example, CVD (including plasma CVD). The first conductive layer 10 may be formed by, for example, sputtering or vapor deposition.

Information that relates to the density of the first layer 30 is obtained by, for example, an X-ray reflectivity measurement (XRR (X-Ray Reflectivity)), Rutherford backscattering spectrometry (RBS), etc.

Information that relates to the composition of the first layer 30 is obtained by, for example, electron energy loss spectrometry (EELS), secondary ion mass spectrometry (SIMS), RBS, X-ray photoelectron spectroscopy (XPS), etc.

Information that relates to the multiple holes 35 of the first layer 30 is obtained by, for example, an electron microscope, etc. For example, information that relates to the amount of the holes 35 and the sizes of the holes 35 is obtained by, for example, the positron annihilation lifetime technique, STEM, etc.

According to the embodiments, a variable resistance element and a memory device can be provided in which stable operations are possible.

In this specification, the state of being electrically connected includes the state in which two conductors are in direct contact. The state of being electrically connected includes the state in which two conductors are connected by another conductor (e.g., an interconnect, etc.). The state of being electrically connected includes the state in which a switching element (a transistor or the like) is provided on a path between two conductors, and a state is formable in which a current flows in the path between the two conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in variable resistance elements and memory devices such as conductive layers, layers, interconnects and controller etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A variable resistance element, comprising:
   a first conductive layer including at least one selected from the group consisting of silver, copper, zinc, titanium, vanadium, chrome, manganese, iron, cobalt, nickel, tellurium, and bismuth;
   a second conductive layer including at least one selected from the group consisting of platinum, gold, iridium, tungsten, palladium, rhodium, titanium nitride, and silicon; and
   a first layer including oxygen and silicon and being provided between the first conductive layer and the second conductive layer, the first layer including a plurality of holes, the holes being smaller than a thickness of the first layer along a first direction, the first direction being from the second conductive layer toward the first conductive layer, the first layer not including carbon, or a composition ratio of carbon included in the first layer to silicon included in the first layer being less than 0.1.

2. The variable resistance element according to claim 1, wherein a composition ratio of oxygen included in the first layer to silicon included in the first layer is greater than 2.0 and not more than 2.4.

3. The variable resistance element according to claim 1, wherein an average length of the plurality of holes along the first direction is not more than 0.5 times the thickness.

4. The variable resistance element according to claim 1, wherein an average length of the plurality of holes along the first direction is not less than 0.6 nm and not more than 1.5 nm.

5. The variable resistance element according to claim 1, wherein the thickness is not less than 2 nanometers and not more than 10 nanometers.

6. The variable resistance element according to claim 1, wherein
   the second conductive layer includes at least one of polycrystalline silicon or amorphous silicon,
   the polycrystalline silicon includes at least one element selected from the group consisting of boron, arsenic, and phosphorus, and
   the amorphous silicon includes the element.

7. The variable resistance element according to claim 1, wherein a density of the first layer is not less than 1.5 $g/cm^3$ but less than 2.2 $g/cm^3$.

8. The variable resistance element according to claim 1, wherein the first conductive layer includes at least one selected from the group consisting of silver and copper.

9. The variable resistance element according to claim 1, further comprising a second layer provided between the first conductive layer and the first layer,
   a relative dielectric constant of the second layer being higher than a relative dielectric constant of the first layer.

10. The variable resistance element according to claim 9, wherein
    the second layer includes an oxide or an oxynitride,
    the oxide includes at least one selected from the group consisting of aluminum, hafnium, titanium, tantalum, and zirconium, and
    the oxynitride includes at least one selected from the group consisting of aluminum, hafnium, titanium, tantalum, zirconium, and silicon.

11. A memory device, comprising:
    the variable resistance element according to claim 1; and
    a controller electrically connected to the first conductive layer and the second conductive layer,
    the controller is configured to implement
       a first operation of setting a first potential of the first conductive layer to be higher than a second potential of the second conductive layer, and
       a second operation of setting the first potential to be lower than the second potential,
    a first electrical resistance between the first conductive layer and the second conductive layer after the first operation being lower than a second electrical resistance between the first conductive layer and the second conductive layer after the second operation.

* * * * *